US012575338B2

(12) United States Patent
Heiss et al.

(10) Patent No.: US 12,575,338 B2
(45) Date of Patent: Mar. 10, 2026

(54) PHASE CHANGE SWITCH FABRICATED WITH FRONT END OF THE LINE PROCESS

(71) Applicant: Infineon Technologies AG, Neubiberg (DE)

(72) Inventors: Dominik Heiss, Munich (DE); Matthias Markert, Weinboehla (DE)

(73) Assignee: Infineon Technologies AG, Neubiberg (DE)

( * ) Notice: Subject to any disclaimer, the term of this patent is extended or adjusted under 35 U.S.C. 154(b) by 869 days.

(21) Appl. No.: 17/826,355

(22) Filed: May 27, 2022

(65) Prior Publication Data

US 2023/0389451 A1 Nov. 30, 2023

(51) Int. Cl.
*H10N 70/00* (2023.01)
*H10N 70/20* (2023.01)

(52) U.S. Cl.
CPC ......... *H10N 70/823* (2023.02); *H10N 70/066* (2023.02); *H10N 70/231* (2023.02); *H10N 70/8613* (2023.02)

(58) Field of Classification Search
CPC . H10N 70/011; H10N 70/884; H10N 70/8828
See application file for complete search history.

(56) References Cited

U.S. PATENT DOCUMENTS

| | | | | |
|---|---|---|---|---|
| 9,368,720 B1* | 6/2016 | Moon | ............... | H10N 70/8828 |
| 2020/0058857 A1* | 2/2020 | Rose | .................... | H10N 70/011 |
| 2020/0058862 A1* | 2/2020 | Howard | .............. | H10N 70/011 |
| 2021/0035639 A1* | 2/2021 | Cohen | ............... | H10N 70/8613 |
| 2021/0280637 A1 | 9/2021 | Taddiken et al. | | |
| 2022/0392958 A1* | 12/2022 | Kobayashi | ............. | H10N 79/00 |

* cited by examiner

*Primary Examiner* — Ajay Ojha
*Assistant Examiner* — Hajar Kolahdouzan
(74) *Attorney, Agent, or Firm* — Murphy, Bilak & Homiller, PLLC

(57) ABSTRACT

A method includes providing a semiconductor substrate comprising a main surface, forming a dielectric region on the main surface, forming a recess in the dielectric region, forming a strip of phase change material within the recess, forming a heating element that is thermally coupled to the strip of phase change material, forming an interconnection region over the main surface before or after forming the recess, the interconnection region including a metallization layer and a dielectric layer, electrically connecting the strip of phase change material to a connecting one of the metallization layers from the interconnection region, and completing formation of the interconnection region after electrically connecting the strip of phase change material, wherein completing formation of the interconnection region includes forming an outer one of the dielectric layers from the interconnection region that is disposed over the connecting one of the metallization layers and comprises a planar upper surface.

14 Claims, 12 Drawing Sheets

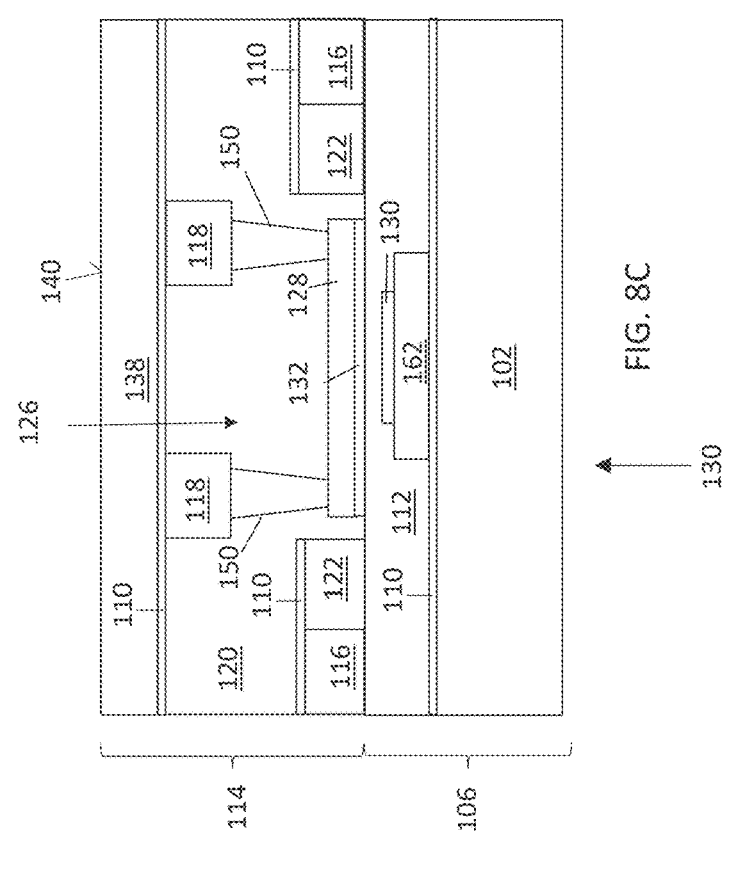
FIG. 8C
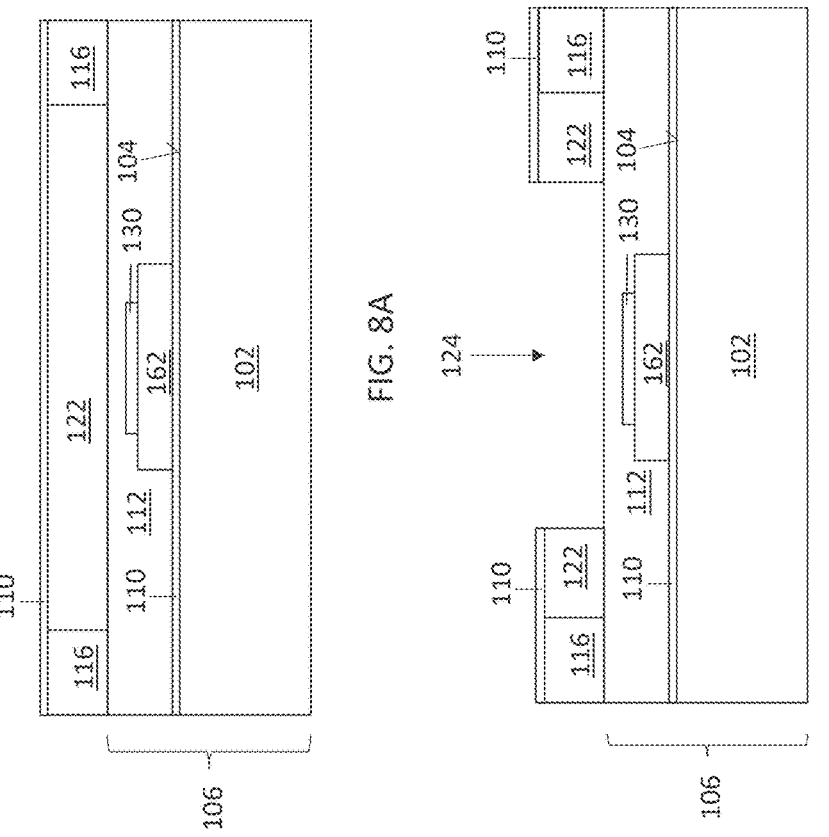
FIG. 8A
FIG. 8B
FIGURE 8

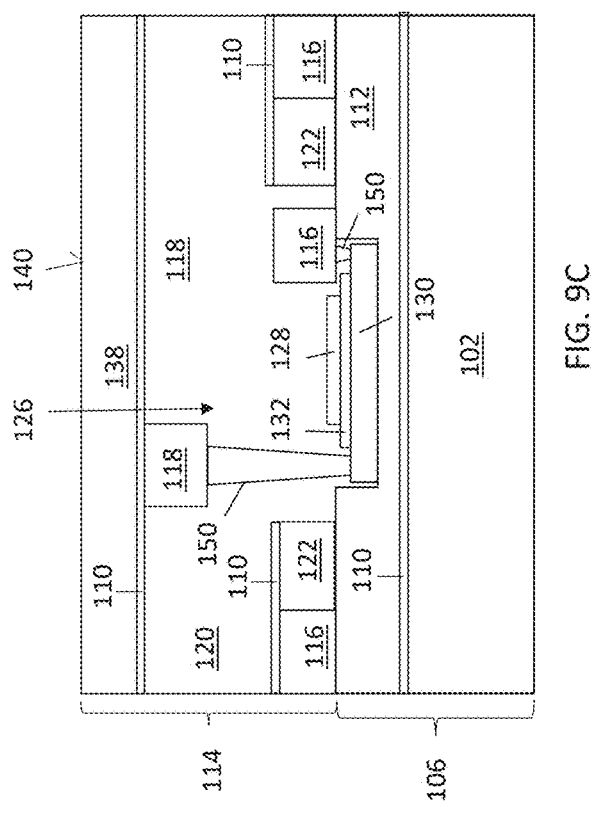
FIG. 9C
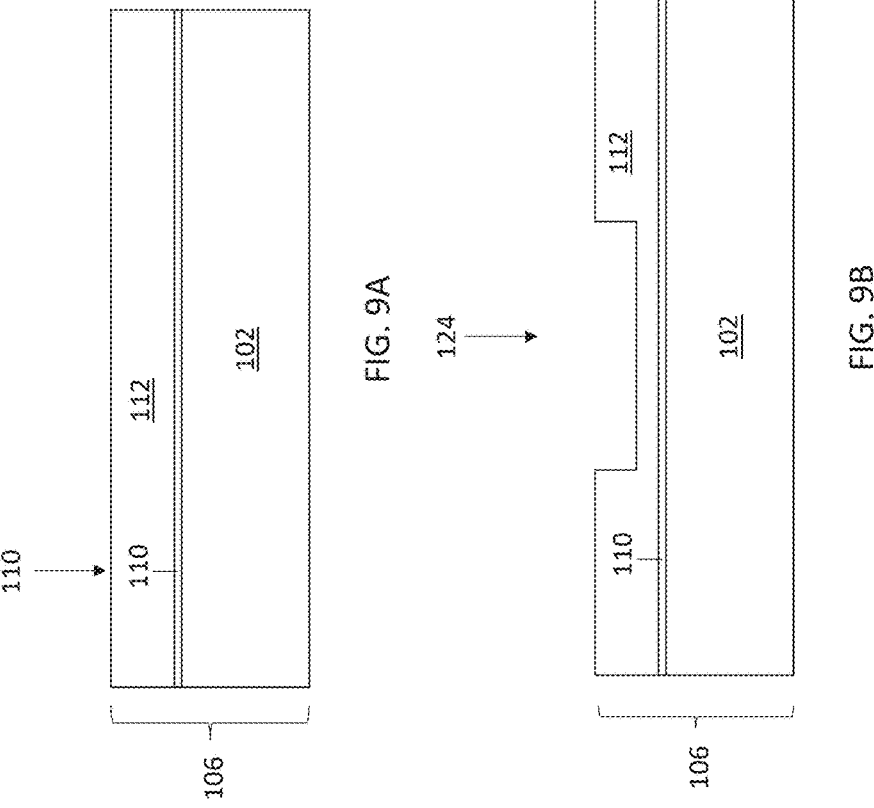
FIG. 9A
FIG. 9B
FIGURE 9

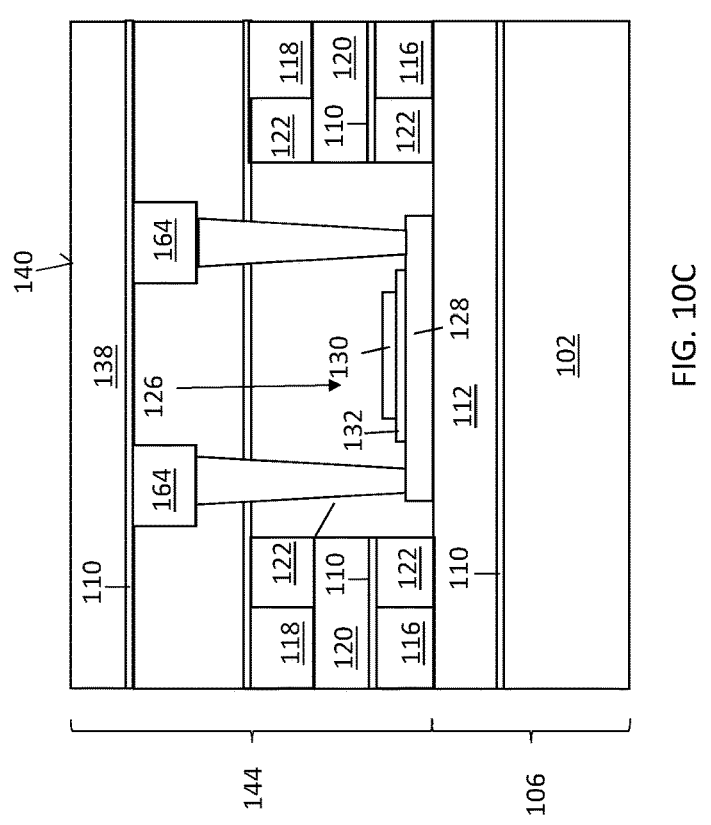
FIG. 10C
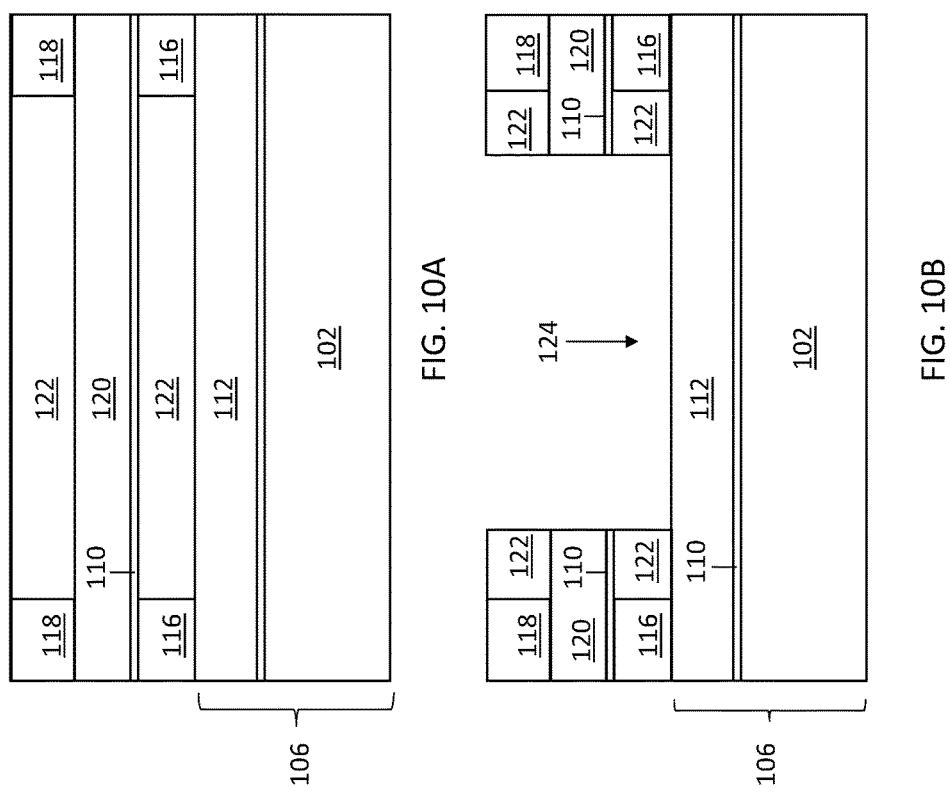
FIG. 10A
FIG. 10B

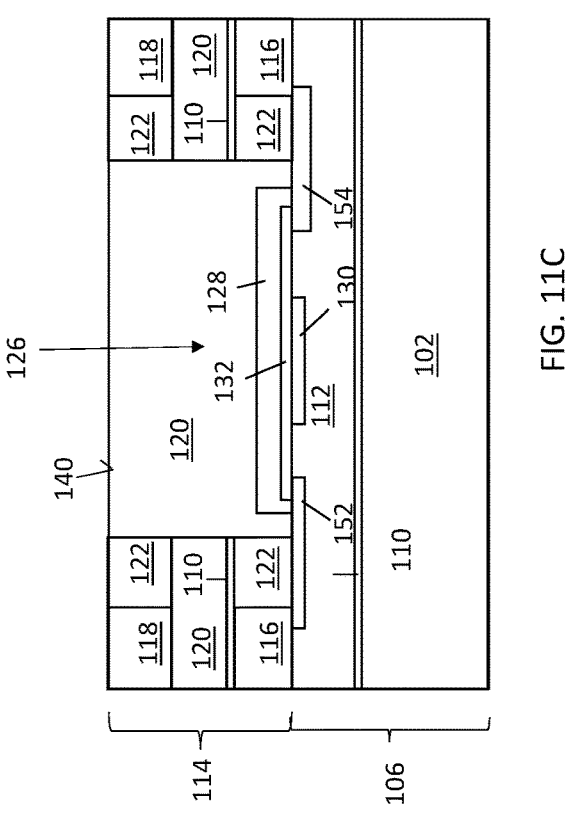
FIG. 11C
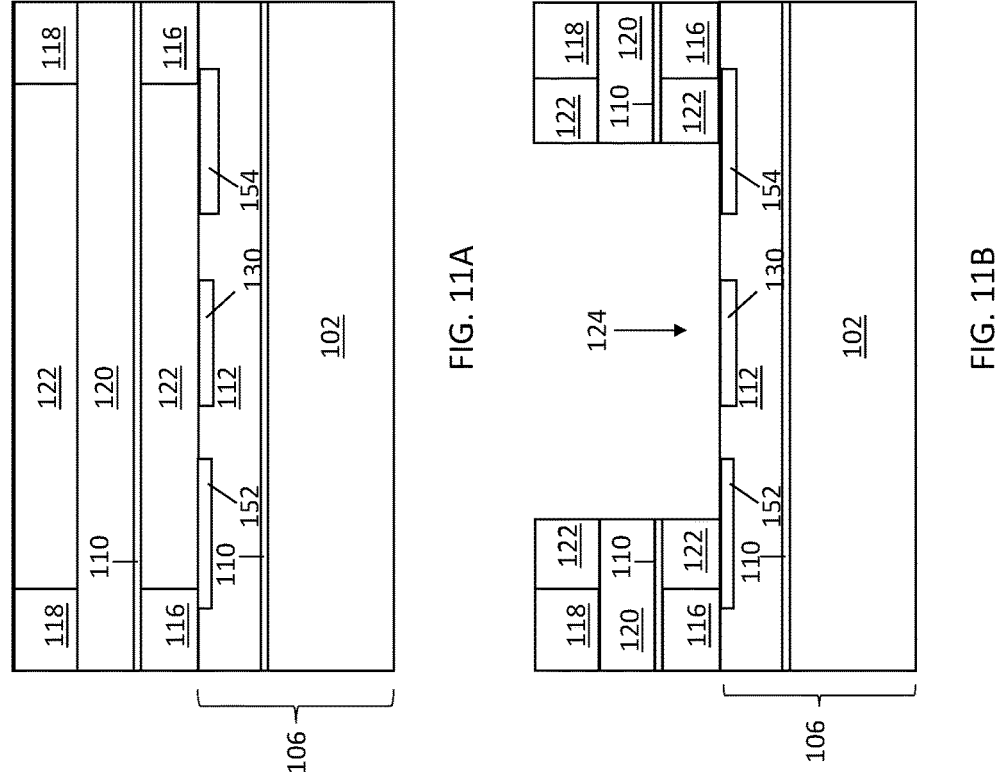
FIG. 11A
FIG. 11B

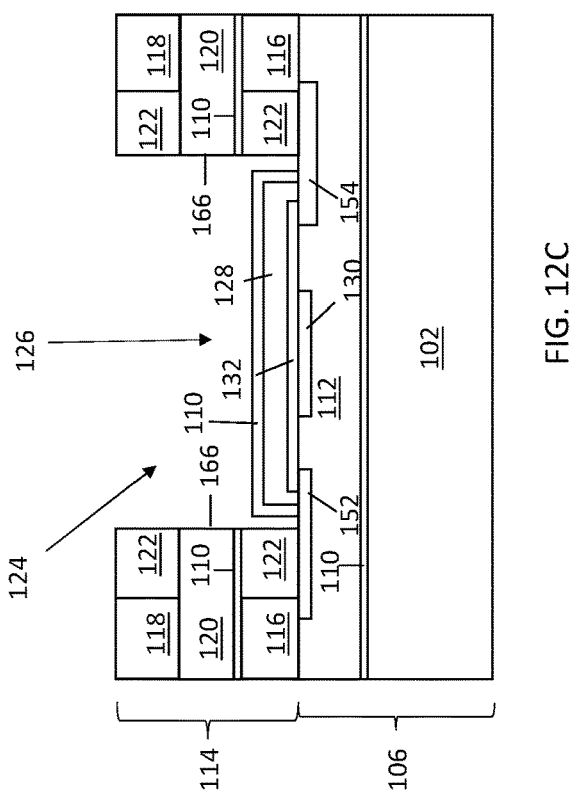
FIG. 12C
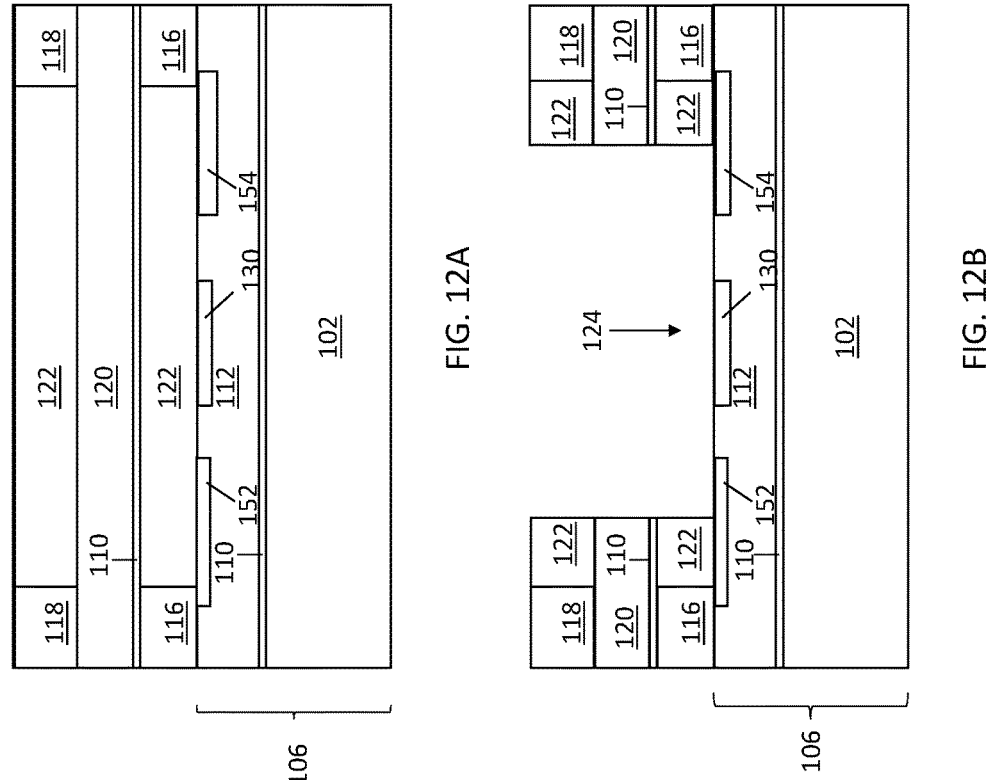
FIG. 12A
FIG. 12B

PHASE CHANGE SWITCH FABRICATED WITH FRONT END OF THE LINE PROCESS

BACKGROUND

Modern electronics applications require switching devices capable of accommodating very high frequency signals. For example, fifth generation wireless applications (5G) may operate in frequency bands on the order of 24 GHz (gigahertz) or higher. Maintaining the correct ON/OFF ratio/isolation versus insertion loss/$R_{ON}$ (on-resistance) and $C_{OFF}$ (off-capacitance) is difficult or impossible to achieve in current semiconductor switching technologies, such as CMOS technology. Phase change switches represent one promising technology that can meet high frequency requirements for 5G applications. A phase change switch utilizes a phase change material to control a conductive connection between two terminals. The switching operation is performed by transitioning the phase change material between phases, e.g., through the application of heat to the phase change material. While promising, phase change switches are in the early stages of development and some design challenges are yet to be resolved. To leverage the full potential of phase change switches, it may be advantageous to fabricate phase change switches together with other device types, e.g., CMOS devices or bipolar devices, in a common integrated circuit. Current solutions for doing so involve undesirable drawbacks, such as poor thermal performance and limited materials from which to form the heating element.

SUMMARY

A method of forming a semiconductor device that comprises a phase change material switching device is disclosed. According to an embodiment, the method comprises providing a semiconductor substrate comprising a main surface, forming a dielectric region on the main surface, forming a recess in the dielectric region, forming a strip of phase change material within the recess, forming a heating element that is thermally coupled to the strip of phase change material, forming an interconnection region over the main surface before or after forming the recess, the interconnection region comprising one or more metallization layers and one or more dielectric layers, electrically connecting the strip of phase change material to a connecting one of the metallization layers from the interconnection region, and completing formation of the interconnection region after electrically connecting the strip of phase change material, wherein completing formation of the interconnection region comprises forming an outer one of the dielectric layers from the interconnection region that is disposed over the connecting one of the metallization layers and comprises a planar upper surface.

According to another embodiment, the method comprises providing a semiconductor substrate comprising a main surface, forming first and second RF pads and a heating element over the main surface, forming a recess in a dielectric region over the main surface such that the first and second RF pads and the heating element are exposed at a bottom of the recess, forming an interconnection region after forming the first and second RF pads, the interconnection region comprising one or more metallization layers and one or more dielectric layers, forming a strip of phase change material within the recess such that the heating element is thermally coupled to the strip of phase change material and such that the first and second RF pads are in ohmic contact with the strip of phase change material, and electrically connecting the first and second RF pads to a connecting one of the metallization layers from the interconnection region.

A semiconductor device is disclosed. According to an embodiment, the semiconductor device comprises a semiconductor substrate comprising a main surface, a dielectric region on the main surface, a recess in the dielectric region, a strip of phase change material within the recess, a heating element that is thermally coupled to the strip of phase change material, and an interconnection region disposed over the main surface that comprises one or more metallization layers and one or more dielectric layers, wherein the strip of phase change material is electrically connected to a connecting one of the metallization layers from the interconnection region, and wherein an outer one of the dielectric layers from the interconnection region is disposed over the connecting one of the metallization layers and comprises a planar upper surface.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 8, which includes FIGS. 8A, 8B and 8C, illustrates a method of forming a semiconductor device that comprises a PCM switching device, according to an embodiment.

FIG. 9, which includes FIGS. 9A, 9B and 9C, illustrates a method of forming a semiconductor device that comprises a PCM switching device, according to an embodiment.

FIG. 10, which includes FIGS. 10A, 10B and 10C, illustrates a method of forming a semiconductor device that comprises a PCM switching device, according to an embodiment.

FIG. 11, which includes FIGS. 11A, 11B and 11C, illustrates a method of forming a semiconductor device that comprises a PCM switching device, according to an embodiment.

FIG. 12, which includes FIGS. 12A, 12B and 12C, illustrates a method of forming a semiconductor device that comprises a PCM switching device, according to an embodiment.

DETAILED DESCRIPTION

Embodiments of a PCM (phase change material) switching device and corresponding methods of forming the PCM switching device are described herein. The PCM switching device is fabricated by forming a recess in a dielectric region that is over a semiconductor substrate. At least some of the elements of the PCM switching device are formed in the recess. This technique allows for the PCM switching device to be arranged closely to the semiconductor substrate, with only a small thickness of dielectric material existing between the bottom of the recess and the main surface of the semiconductor substrate. As a result, advantageous thermal characteristics are obtained, as the semiconductor substrate acts as a heat sink mechanism to extract heat away from the PCM switching device. Moreover, at least some of the elements of the PCM switching device can be formed by so-called FEOL (front end of the line) processing steps that are used to form active device structures. This allows for the PCM switching device to be formed simultaneously with other devices, e.g., CMOS devices, bipolar devices, etc., on a single semiconductor substrate with minimal extraneous processing steps.

Figure 1:
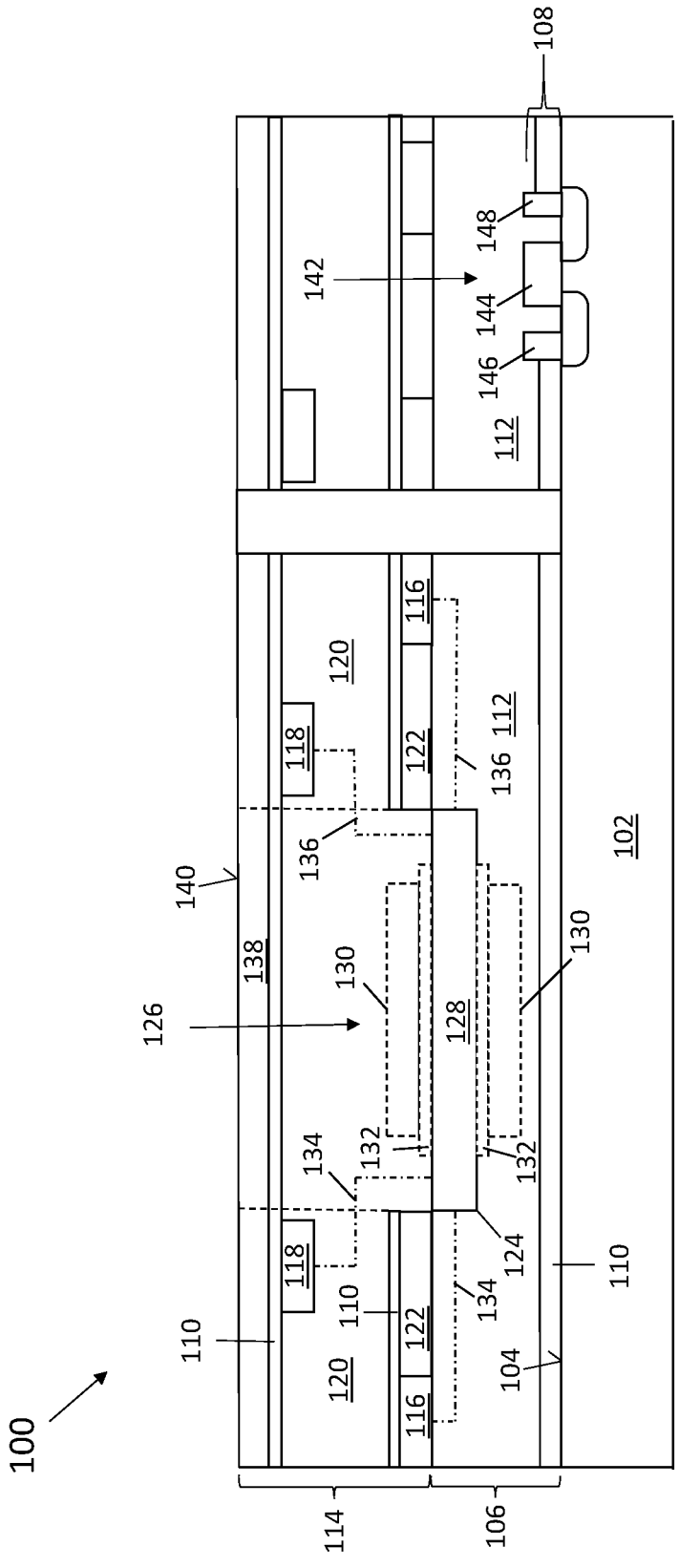
FIG. 1 illustrates a semiconductor device that comprises a PCM switching device, according to an embodiment.

Referring to FIG. 1, a semiconductor device 100 comprises a semiconductor substrate 102. The semiconductor substrate 102 may be any type of base structure that is compatible with semiconductor processing techniques. For example, the substrate 102 can be a commercially available bulk semiconductor wafer, e.g., a silicon wafer. Other types of semiconductors such as silicon carbide (SiC), or silicon germanium (SiGe), type III-V semiconductors, etc., may be present in the semiconductor substrate 102 and/or form the base material of the semiconductor substrate 102. The semiconductor substrate 102 includes a main surface 104, which may be a substantially planar surface.

The semiconductor device 100 comprises a FEOL (front-end off-line) region 106 disposed on the main surface 104 of the substrate. The FEOL region 106 is formed during an initial phase of device fabrication, i.e., the FEOL process, that forms the active device features in the substrate, e.g., drain, source, emitter collector regions, gate structures, etc. The FEOL process comprises all of the processing steps to form the active device features, e.g., dopant implantation, dopant activation, trench etching, etc. The process additionally comprises the formation of a lower interconnect layer 108 on the main surface 104 of the substrate that is used to form electrode and contact structures, such as gate electrodes, source or drain contacts, etc. The FEOL process may additionally comprise the formation of lower-level dielectric layers that protect the main surface 104 of the substrate and/or electrically isolate the features formed in the lower interconnect layer 108. For example, the FEOL region 106 may comprise a passivation layer 110 formed on the main surface 104, and a pre-metal dielectric 112 that covers the conductive elements formed in the FEOL region 106. The passivation layer 110 may comprise metal oxides and nitrides, e.g., aluminum nitride (AlN), silicon nitride (SiN$_X$) aluminum oxynitride (AlO$_X$N$_Y$), etc. The pre-metal dielectric 112 may comprise semiconductor oxides and nitrides, e.g., silicon nitride (SiN$_X$), silicon dioxide (SiO$_2$), silicon oxynitride (SiO$_X$N$_Y$).

The semiconductor device 100 comprises an interconnection region 114, which corresponds to a so-called BEOL (back-end of the line) region of the device. The BEOL is formed by further processing steps, i.e., the BEOL process, that are performed after the FEOL processing steps. The BEOL process comprises all processing steps that form upper-level interconnections of the semiconductor device 100. These upper-level interconnections electrically connect the various devices fabricated on or within the semiconductor substrate 102 to one another and/or to provide vertical connection between these devices and externally accessible terminals (e.g., bond pads) on an outer surface of the semiconductor device 100.

This interconnection region 114 comprises one or more metallization layers. The metallization layers of the interconnection region 114 are structured into conductive tracks that are routed along a wiring plane to form electrical interconnect. The number of metallization layers of the interconnection region 114 may vary. As shown, interconnection region 114 comprises a first level metallization layer 116 (i.e., an "M1" layer) and a second level metallization layer 118 (i.e., an "M2" layer). The first level metallization layer 116 is the closest metallization layer of the interconnection region 114 to the main surface 104. The second level metallization layer 118 is disposed over the first level metallization layer 116 and is the second-closest metallization layer of the interconnection region 114 to the main surface 104. In principle, the interconnection region 114 can comprise any further number of metallization levels, e.g., a third level metallization layer (i.e., an "M3" layer), a fourth level metallization layer (i.e., an "M4" layer), wherein the basic stacking sequence of dielectric and metallization is repeated. Alternatively, the interconnection region 114 can comprise a single first level metallization layer 116 as the only upper-level interconnect layer of the semiconductor device 100.

This interconnection region 114 comprises one or more dielectric layers that provide lateral and vertical isolation to the metallization layers. As shown, the dielectric layers comprise an interlayer dielectric region 120 that provides electrical isolation between the different metallization layers, a laterally isolating dielectric region 122 that provides lateral electrical isolation between the conductive tracks formed in the same metallization layer, and passivation layers 110 on top of each level of metallization. The interlayer dielectric region 120 and the laterally isolating dielectric region 122 may be formed from electrically insulating materials such as silicon dioxide (SiO$_2$), silicon oxynitride (SiO$_X$N$_Y$), glass, polymers, etc.

According to an embodiment, the interconnection region 114 comprises an outer dielectric layer 138 that is disposed over each metallization layer of the interconnection region 114. The outer dielectric layer 138 is the last dielectric layer that is formed by the BEOL process and may have the same composition as the interlayer dielectric regions 120. The outer dielectric layer 138 may comprise a planar upper surface 140, which forms at least part of an exposed outer side of the device. The planar upper surface 140 is a surface that extends along a single plane throughout a complete area of the semiconductor device 100. The semiconductor device may further comprise external bond pads (not shown) that are formed on the planar upper surface 140 and form externally accessible points of contact to the various terminals of the semiconductor device 100. However, all of the electrical interconnect between various elements of the semiconductor device 100 occurs below the outer dielectric layer 138.

The BEOL process as disclosed herein refers to a process that starts with the fabrication of a metallization layer. Thus, the BEOL process refers to all process steps occurring during or after the formation of the first level metallization layer 116. The FEOL process thus comprises any processing steps are performed before the formation of the first level metallization layer 116. Thus, the lower interconnect layer 108, which is part of the FEOL region 106 and is formed by the FEOL process, is formed before forming any of the metallization layers of the interconnect region 114. Moreover, the lower interconnect layer 108 may comprise a conductive material with a different composition as each of the metallization layers of the interconnect region. For example, the lower interconnect layer 108 may be formed from materials such as tungsten, polysilicon, or a metal silicide, whereas each metallization layer of the interconnection region 114 may comprise copper, aluminum, nickel, etc., and alloys thereof.

The semiconductor device 100 comprises a recess 124 formed in a dielectric region. The dielectric region that the recess 124 is formed in comprises a lowermost one of the dielectric layers of the interconnection region 114, i.e., the laterally isolating dielectric region 122 adjacent the first level metallization layer 116. Optionally, the recess 124 may extend into the pre-metal dielectric 112 from the FEOL portion of the device. Separately or in combination, the recess 124 may extend through multiple dielectric levels of the interconnection region 114. For example, as shown, the sidewalls of the recess 124 may optionally extend through each of the dielectric layers of the interconnection region 114 and reach the planar upper surface 140.

The semiconductor device 100 comprises a PCM switching device 126. The PCM switching device 126 comprises a strip of phase change material 128, a heating element 130, and first and second RF contacts (not shown in FIG. 1) that are each in ohmic contact with the strip of phase change material 128 at opposite ends. The working principle of the PCM switching device 126 is as follows. The heating element 130 is configured to control a conductive connection between first and second RF terminals that are electrically connected to the strip of phase change material 128. The heating element 130 controls this conductive connection by applying heat to the strip of phase change material 128. In an OFF state of the PCM switching device 126, the phase change material from the strip of phase change material 128 is in an amorphous state or partially amorphous. As a result, the strip of phase change material 128 blocks a voltage applied to the first and second RF terminals. In an ON state of the PCM switching device 126, the phase change material of the strip of phase change material 128 is in a crystalline state. As a result, the strip of phase change material 128 provides a low-resistance electrical connection between the first and second RF terminals. The PCM switching device 126 performs a switching operation by using the heating element 130 to heat the strip of phase change material 128. The phase change material may be transitioned to the amorphous state by applying short pulses (e.g., pulses in the range of 50-1,000 nanoseconds) of high intensity heat which causes the phase change material to reach a melting temperature, e.g., in the range of 600° C. to 750° C., followed by a rapid cooling of the material. This is referred to as a "reset pulse." The phase change material of the strip of phase change material 128 may be transitioned to the crystalline state by applying longer duration pulses (e.g., pulses in the range of 0.5-10 microseconds) of lower intensity heat, which causes the phase change material to reach a temperature at which the material quickly crystallizes and is highly conductive, e.g., in the range of 250° C. to 350° C. This is referred to as a "set pulse."

The strip of phase change material 128 is formed from a material that can be transitioned between two different phases that each have different electrical conductivity. For example, the strip of phase change material 128 may comprise a material that changes from an amorphous state to a crystalline state based upon the application of heat to the phase change material, wherein the phase change material is electrically insulating (i.e., blocks an electrical connection)

in the amorphous state and is electrically conductive (i.e., provides a low electrical resistance current path) in the crystalline state. Examples of phase change materials having this property include chalcogenides and chalcogenide alloys. Specifically, these phase change materials may include germanium-antimony-tellurium (GST), germanium-tellurium, and germanium-antimony.

The heating element 130 is thermally coupled to the strip of phase change material 128. This means that the heating element 130 is in sufficient proximity to the strip of phase change material 128 to rapidly transfer heat to change the conductive state of the strip of phase change material 128 in the above-described manner. Any intermediary material between the heating element 130 is sufficiently thin and/or thermally conductive to enable efficient heat transfer. According to an embodiment, an insulating liner 132 is interposed between the heating element 130 and the strip of phase change material 128. The insulating liner 132 electrically isolates the heating element 130 from the strip of phase change material 128 while simultaneously permitting substantial heat transfer between the two. To this end, the insulating liner 132 may be a relatively thin (e.g., less than 1 μm thick and more typically less than 100 nm thick) layer of dielectric material, e.g., silicon dioxide ($SiO_2$), silicon nitride (SiN), etc.

The heating element 130 is formed from a conductive or semi-conductive material that converts electrical energy into heat through ohmic heating. According to an embodiment, the heating element 130 is formed in the FEOL process. Thus, the material of the heating element 130 may correspond to the same materials used to form the lower interconnect layer 108. In embodiments, the heating element 130 is formed simultaneously with other elements of the lower interconnect layer 108 during the same interconnect formation step. In other embodiments, the heating element 130 is formed separately from other elements of the lower interconnect layer 108, while being formed using the same materials and/or processes. The heating element 130 may be connected between electrically conductive heating terminals that can be biased to force a current through the heating element 130. The heating element 130 may extend transversely to the current flow direction of the phase change material 114 and contact heating terminals in locations that are in different cross-sectional planes than the cross-sectional view of FIG. 1.

The strip of phase change material 128 is electrically connected to a connecting one of the metallization layers from the interconnection region 114. The connecting one of the metallization layers from the interconnection region 114 is a metallization layer that forms or is electrically connected to the first and second RF terminals as described above. This connecting one of the metallization layers can be provided by any one of the metallization layers from the interconnection region 114. The electrical connection between the strip of phase change material 128 and the connecting one of the metallization layers from the interconnection region 114 is provided by first and second RF connections 134, 136. The first and second RF connections 134, 136 comprise first and second RF contacts (examples of which will be described below) that are each in ohmic contact with the strip of phase change material 128 and may additionally comprise further conductive structures to complete the electrical connection. The first and second RF connections 134, 136 can be implemented in a variety of different ways and can be connected different metallization layers of the interconnection region 114. FIG. 1 shows two potential electrical connection configurations. According to a first connection configuration, the connecting one of the metallization layers is the first level metallization layer 116 of the interconnection region 114, and the first and second RF connections 134, 136 form a conductive connection to structured portions of the first level metallization layer 116. According to a second connection configuration, the connecting one of the metallization layers is the second level metallization layer 118 of the interconnection region 114, and the first and second RF connections 134, 136 form a conductive connection to structured portions of the second level metallization layer 118. Along similar lines, the connecting one of the metallization layers may be any upper-level metallization layer of the interconnection region 114 that is spaced apart from the main surface 104 by at least one of the one or more metallization layers of the interconnection region 114, wherein the first and second RF connections 134, 136 provide the necessary electrical connection between the strip of phase change material 128 and structure portions of the first and second RF connections 134, 136.

The strip of phase change material 128 is arranged within the recess 124. The heating element 130 may be arranged within the recess 124 or may be arranged outside of the recess 124. For example, FIG. 1 shows two potential arrangements for the heating element 130. According to a first configuration, the heating element 130 and the insulating liner 132 are formed over the strip of phase change material 128 and are thus arranged within the recess 124. According to a second configuration, the heating element 130 is formed below the recess 124 within the pre-metal dielectric 112.

According to an embodiment, the semiconductor device 100 further comprises an active semiconductor device 142 formed in a region of the semiconductor substrate 102 that is laterally adjacent to the recess 124. The active semiconductor device 142 can be formed in a different device technology and/or have a different working principle as the PCM switching device 126. Separately or in combination, the active semiconductor device 142 may comprise active doped regions that are formed in the semiconductor substrate 102. The active semiconductor device 142 can comprise any type of semiconductor device 100, e.g., MOSFET, IGBT, bipolar transistor, diode, thyristor HEMT, etc. The features of these devices may be formed by the FEOL process and at least some of these features may be formed simultaneously with the features of the PCM switching device 126. For example, the electrode structures of these devices, e.g., gate, source contact, drain contact, etc., may be formed in the lower interconnect layer 108 and have the same material composition and/or be formed simultaneously with the features of the PCM switching device 126. FIG. 1 illustrates a MOSFET as an exemplary device type for the active semiconductor device 142, wherein this device comprises a gate electrode 144 and source and drain 146, 148 electrodes formed in the lower interconnect layer 108.

Figures 2, 2A, 2B, 2C:
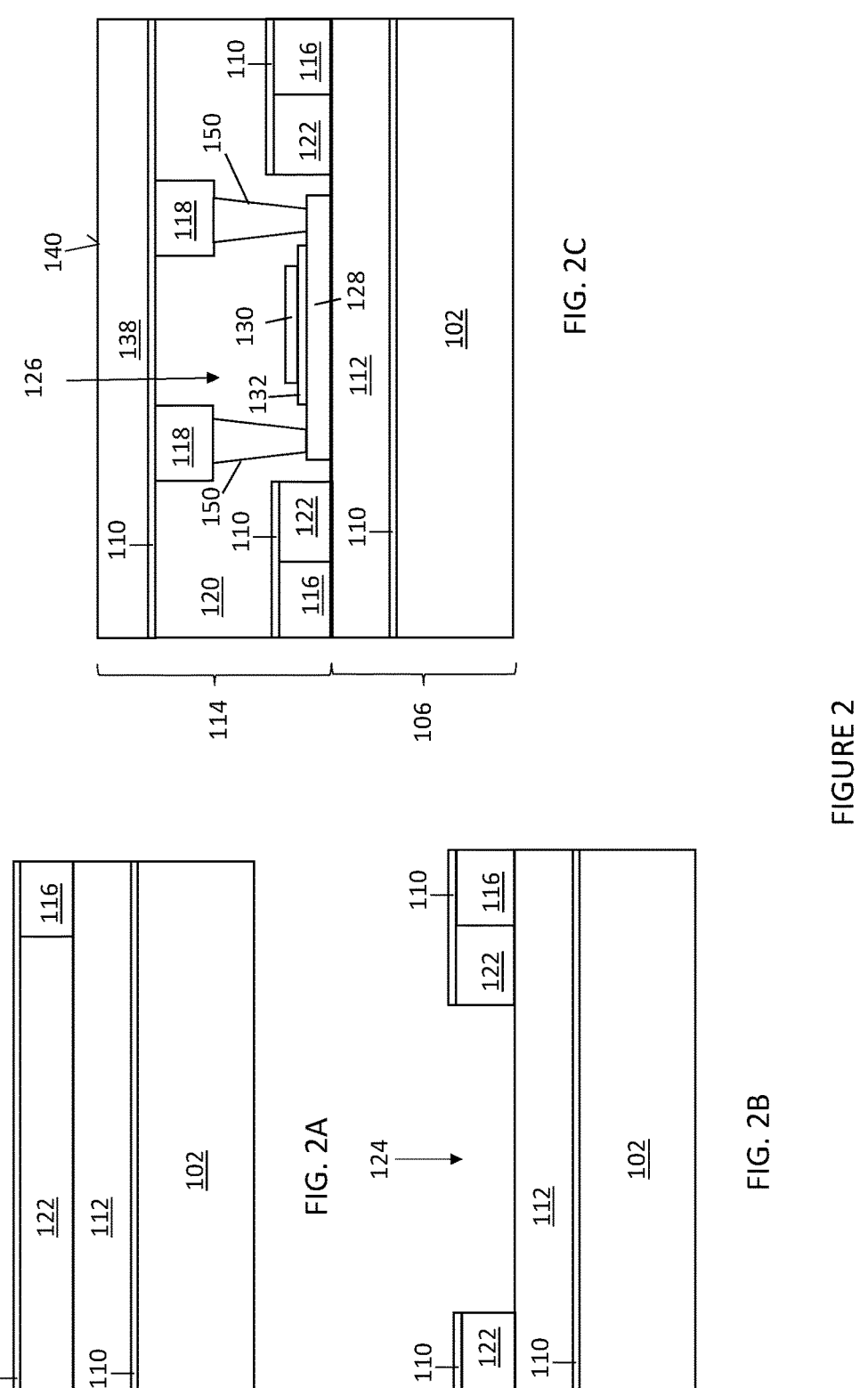
FIG. 2, which includes
FIGS. 2A, 2B and 2C, illustrates a method of forming a semiconductor device that comprises a PCM switching device, according to an embodiment.

Referring to FIG. 2, a method for forming the semiconductor device 100 is shown, according to an embodiment. As shown in FIG. 2A, all FEOL processing steps are performed such that the semiconductor device 100 comprises a passivation layer 110 and the pre-metal dielectric 112. Some BEOL processing steps are performed but the interconnection region 114 is not completed. In particular, the first level metallization layer 116 is formed, the laterally isolating dielectric region 122 is formed, and a passivation layer 110 is formed thereon. As shown in FIG. 2B, the recess 124 is formed in a dielectric region of the semiconductor device 100. The dielectric region of the semiconductor device 100 comprises the laterally isolating dielectric region 122 any may extend into the pre-metal dielectric 112. The recess 124 can be formed by a masked etching technique, for example. As shown in FIG. 2C, the PCM switching device 126 is formed by depositing the strip of phase change material 128 into the recess 124, forming the insulating liner 132 on top of the strip of phase change material 128, and forming the heating element 130 on top of the insulating liner 132. The strip of phase change material 128, the insulating liner 132 and the heating element 130, may be formed by blanket deposition and subsequent masked etching step, for example. The heating element 130 may be formed metals that are well suited to resistive heating, e.g., nickel, chromium, molybdenum, tungsten, etc. In some cases, it may be possible to form the heating element 130 from the same metal or metal alloys as the metallization from the interconnection region 116, e.g., platinum, Ti/Pt or Ti/Pd in the case of a III-V semiconductor device. After forming these features, a further deposition step may be performed to fill the recess 124 with a dielectric material. The dielectric material that fills the recess 124 may comprise any dielectric insulator and may comprise the same material as the interlayer dielectric region 120. The strip of phase change material 128 is electrically connected to the connecting one of the metallization layers from the interconnection region 114. In this case, the connecting one of the metallization layers corresponds to the second level metallization layer 118, and electrically connecting the strip of phase change material 128 to the connecting one of the metallization layers is performed by forming through-vias 150 that extend between structured parts of the second level metallization layer 118 and the strip of phase change material 128. The through-vias 150 thus form the first and second RF contacts and provide the first and second RF connections 134, 136. The through-vias 150 may be formed by forming holes in the dielectric material and filling these holes with a conductive liner, e.g., Ti, TiN, etc., and conductive core material, e.g., tungsten, nickel, copper, aluminum, etc. After electrically connecting the PCM switching device 126 to the connecting one of the metallization layers, formation of the interconnection region 114 is completed. Completing the formation of the interconnection region 114 comprises forming the outer dielectric layer 138 with the planar upper surface 140. Optionally, a planarization technique such as CMP may be performed to planarize the planar upper surface 140.

Figures 3, 3A, 3B, 3C:
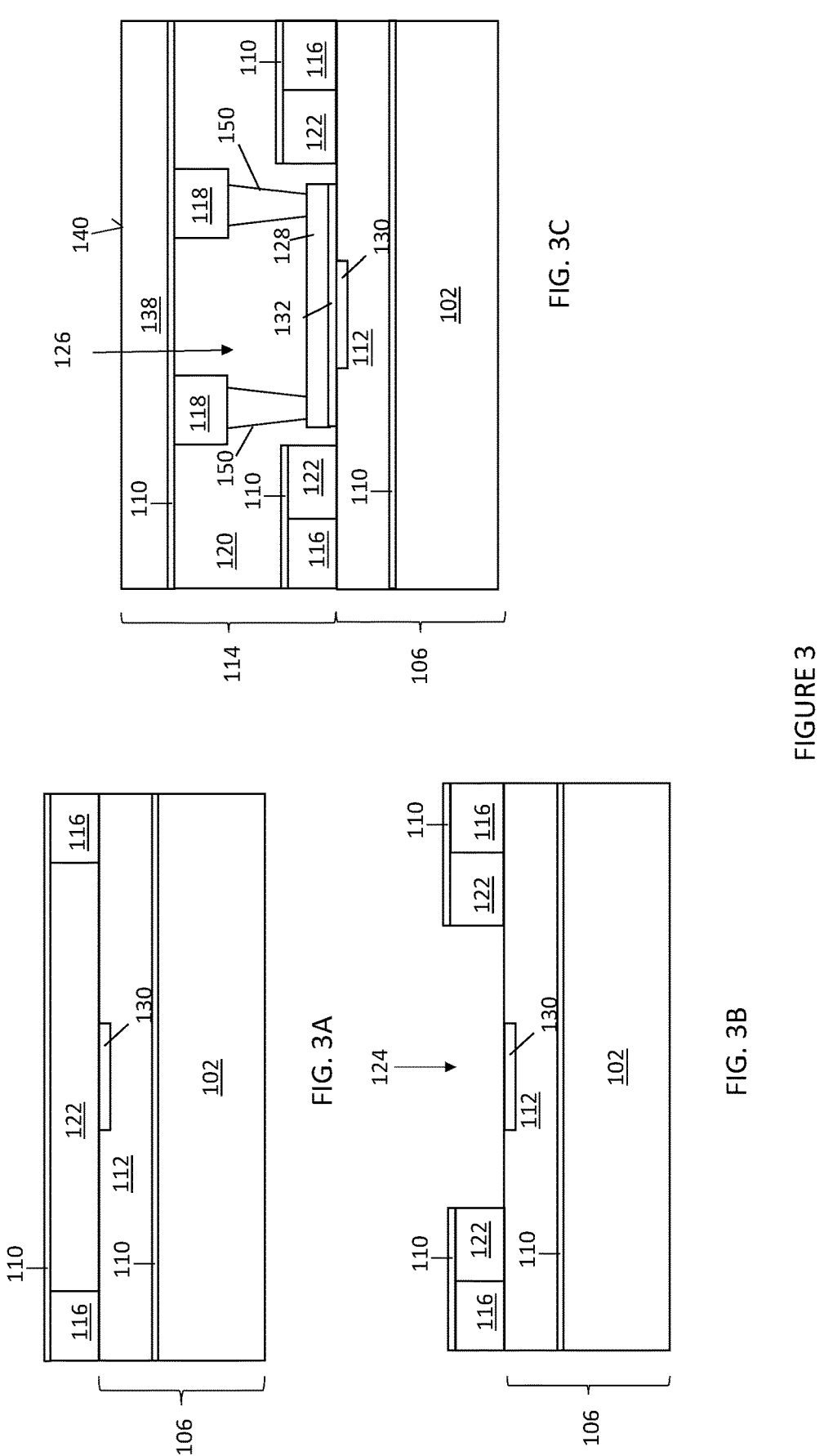
FIG. 3, which includes
FIGS. 3A, 3B and 3C, illustrates a method of forming a semiconductor device that comprises a PCM switching device, according to an embodiment.

Referring to FIG. 3, a method for forming the semiconductor device 100 is shown, according to another embodiment. As shown in FIG. 3A, all FEOL processing steps are performed such that the semiconductor device 100 comprises a passivation layer 110 and the pre-metal dielectric 112. In this case, the heating element 130 is formed during the FEOL process. Thus, the heating element 130 may comprise the same material as the lower interconnect layer 108 that is formed before each metallization layer of the interconnection region 114. Thus, the heating element may comprise tungsten, polysilicon, or a metal silicide. Some BEOL processing steps are performed but the interconnection region 114 is not completed. In particular, the first level metallization layer 116 is formed, the laterally isolating dielectric region 122 is formed, and a passivation layer 110 is formed thereon. As shown in FIG. 3B, the recess 124 is formed in a dielectric region. In this case, the recess 124 is formed to expose an upper side of the heating element 130 in the bottom of the recess 124. As shown in FIG. 3C, the phase change switching device 126 is formed by depositing the insulating liner 132 on the heating element 130 and depositing the strip of phase change material 128 on the insulating liner 132.

Figures 4, 4A, 4B, 4C:
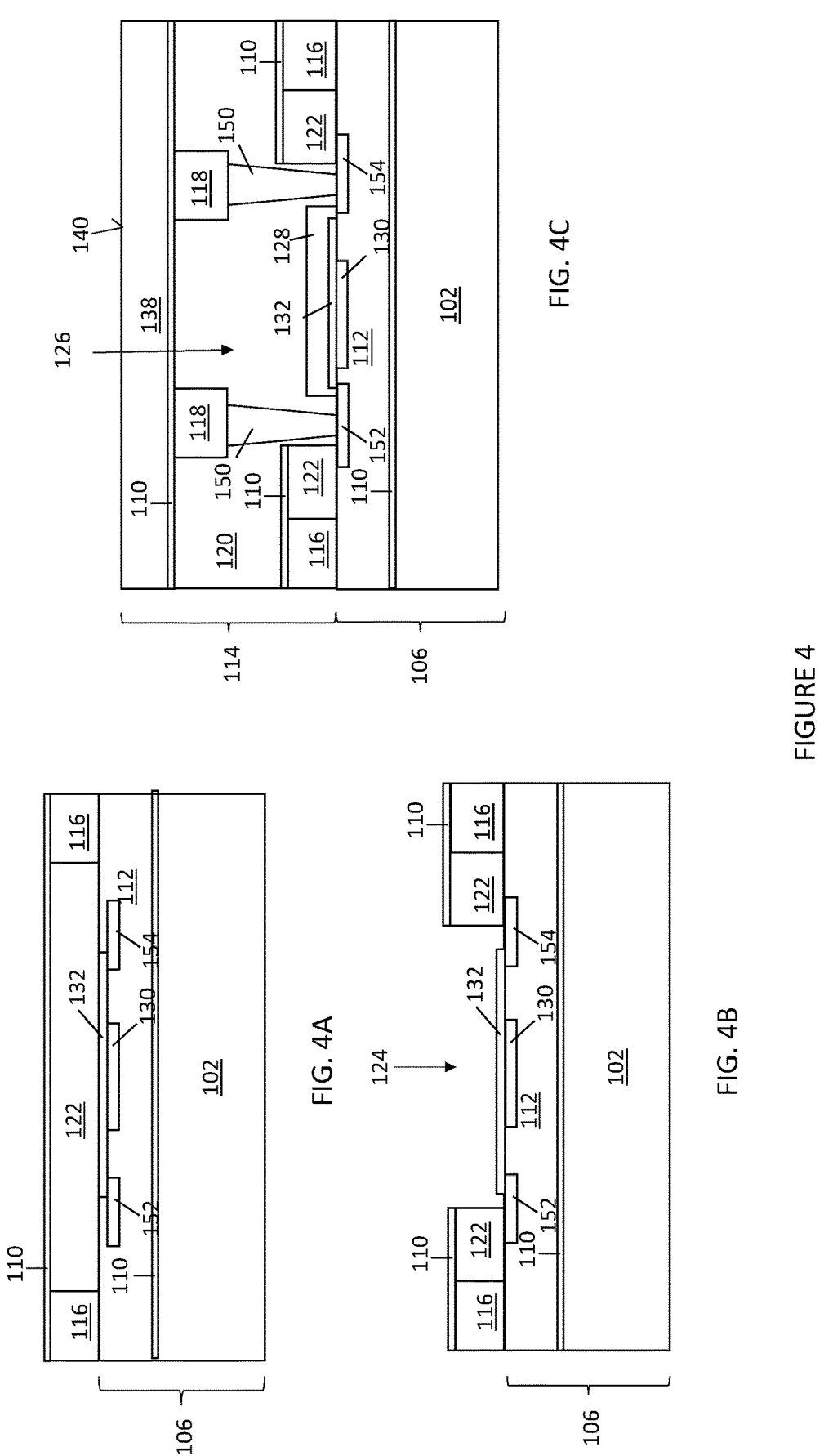
FIG. 4, which includes
FIGS. 4A, 4B and 4C, illustrates a method of forming a semiconductor device that comprises a PCM switching device, according to an embodiment.

Referring to FIG. 4, a method for forming the semiconductor device 100 is shown, according to another embodiment. As shown in FIG. 4A, all FEOL processing steps are performed such that the semiconductor device 100 comprises a passivation layer 110 and the pre-metal dielectric 112. In this case, the heating element 130 and first and second RF pads 152, 154 are formed during the FEOL process. Moreover, the insulating liner 132 is formed during the FEOL process as a pre-structured feature that covers the heating element 130 and partially exposes the first and second RF pads 152, 154. The first and second RF pads 152, 154 may comprise the same material as the lower interconnect layer 108 that is formed before each metallization layer of the interconnection region 114. Thus, the first and second RF pads 152, 154 may comprise tungsten, polysilicon, or a metal silicide. As shown in FIG. 4B, the recess 124 is formed in a dielectric region. In this case, the insulating liner 132 and the upper sides of the first and second RF pads 152, 154 are exposed in the bottom of the recess 124. As shown in FIG. 4C, the phase change switching device 126 is formed by depositing the strip of phase change material 128 in the recess 124 on the insulating liner 132. In this case, the through-vias 150 are formed to extend between structured parts of the second level metallization layer 118 and the first and second RF pads 152, 154. Thus, the first and second RF pads 152, 154 and the through-vias 150 collectively form the first and second RF connections 134, 136.

Figures 5, 5A, 5B, 5C:
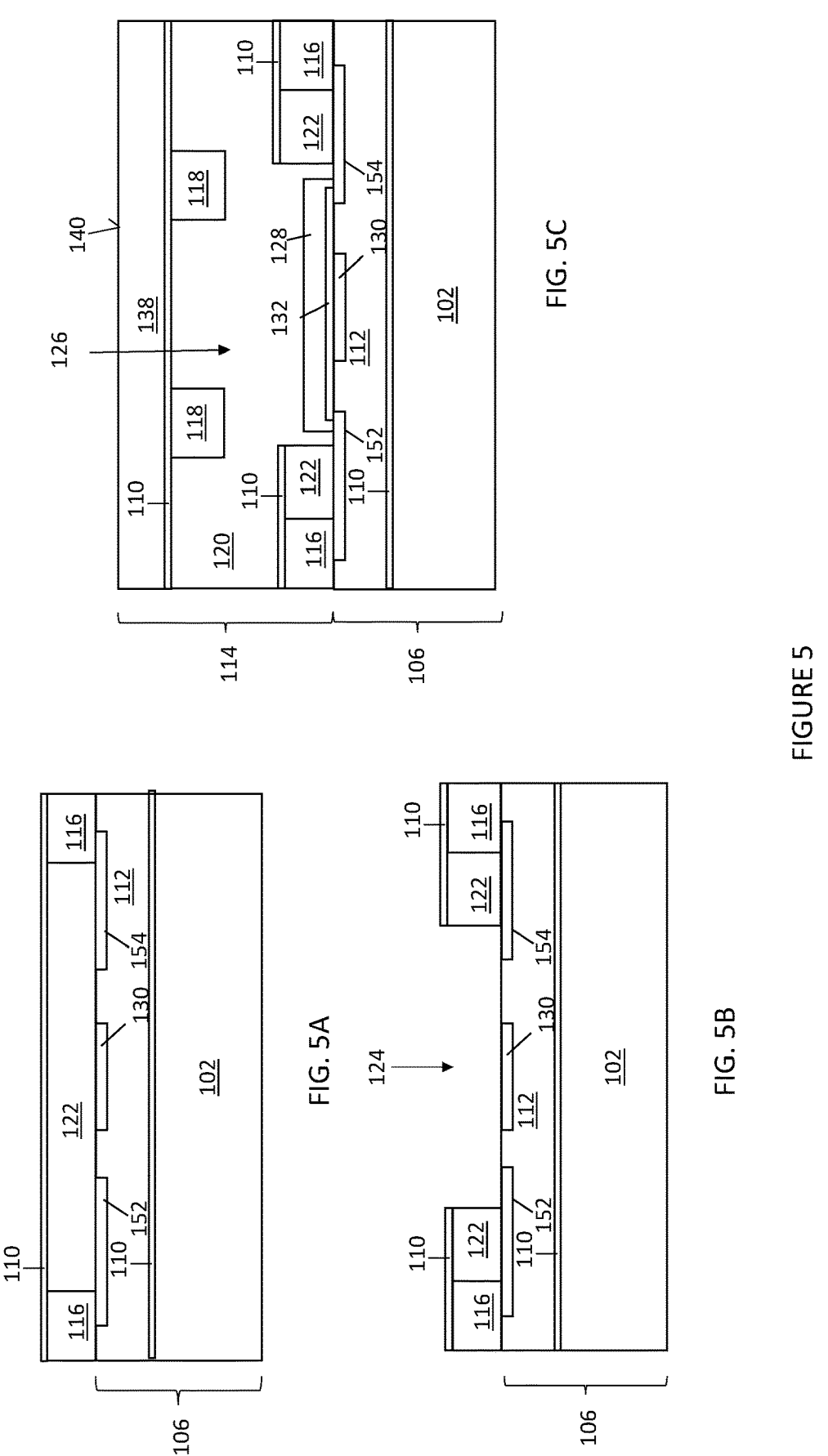
FIG. 5, which includes
FIGS. 5A, 5B and 5C, illustrates a method of forming a semiconductor device that comprises a PCM switching device, according to an embodiment.

Referring to FIG. 5, a method for forming the semiconductor device 100 is shown, according to another embodiment. The method steps shown in FIGS. 5A, 5B and 5C are similar to the respective steps shown in FIGS. 4A, 4B, and 4C, except that the first and second RF pads 152, 154 are configured to form a direct connection to the first level metallization layer 116 and the through-vias 150 are omitted. As shown in FIG. 5A, the first and second RF pads 152, 154 are formed to extend directly underneath and ohmically contact the structured regions of the first level metallization layer 116. Thus, in this embodiment the connecting one of the metallization layers corresponds to the first level metallization layer 116, and the electrically connecting the strip of phase change material 128 to the connecting one of the metallization layers occurs when the strip of phase change material 128 is formed in the recess 124.

Figures 6, 6A, 6B, 6C:
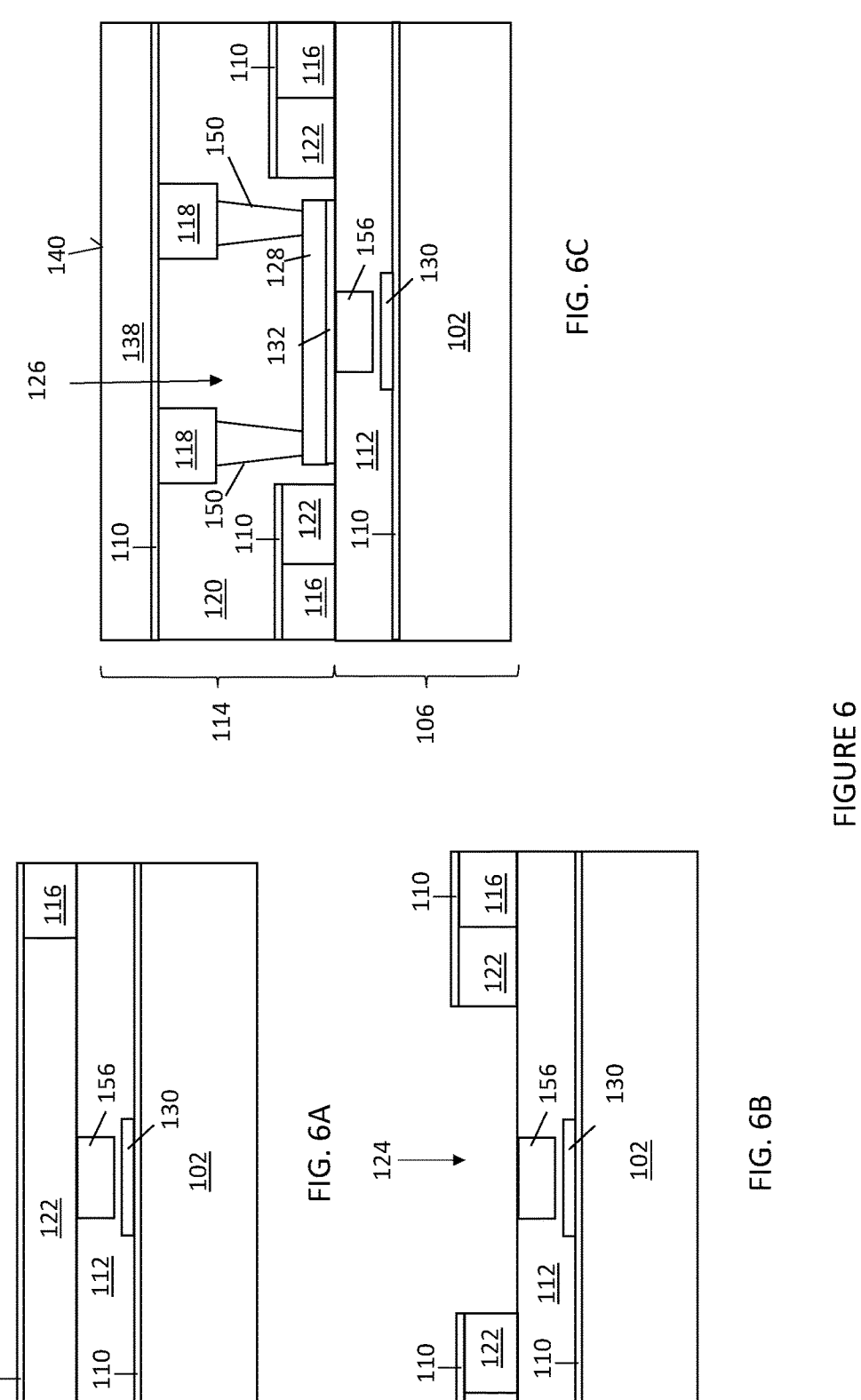
FIG. 6, which includes
FIGS. 6A, 6B and 6C, illustrates a method of forming a semiconductor device that comprises a PCM switching device, according to an embodiment.

Referring to FIG. 6, a method for forming the semiconductor device 100 is shown, according to another embodiment. As shown in FIG. 6A, all FEOL processing steps are performed such that the semiconductor device 100 comprises a passivation layer 110 and the pre-metal dielectric 112. In this case, the heating element 130 is formed during the FEOL process. Different to the previous embodiments, the heating element 130 is formed in close proximity to the semiconductor substrate 102, with only the passivation layer being interposed between the heating element 130 and the semiconductor substrate 102. In this case, the heating element 130 is formed before forming the pre-metal dielectric 112. The FEOL processing steps additionally comprise forming a thermal coupling element 156 within the pre-metal dielectric 112 that is above the heating element 130. The thermal coupling element 156 can be formed from the same materials as the lower interconnect layer 108, e.g., tungsten, polysilicon, metal silicide, etc., or a thermally conductive dielectric material such as aluminum nitride. As shown in FIG. 6B, the recess 124 is formed to expose an upper side of the thermal coupling element 156 at a bottom of the recess 124. As shown in FIG. 6C, the remaining elements of the PCM switching device 126 are formed in the recess 124, the PCM switching device 126 is electrically connected to the first one of the connecting one of the metallization layers, and the formation of the interconnect region is completed. The thermal coupling element 156 thermally couples the strip of phase change material 128 to the heating element 130, which in turn is thermally coupled to the semiconductor substrate 102 region. This arrangement provides a thermally efficient heat transfer path between the PCM switching device 126 and the semiconductor substrate 102, which acts as a heat sink structure. According to an embodiment, the thermal coupling element 156 is configured as a passive element, meaning that it serves purely a cooling function and cannot be controlled by an external signal. Separately or in combination, the heating element 130 may be arranged as an active or passive heating device that is formed in the lower interconnect layer 108, e.g., a transistor, gate-poly resistor, or diode structure.

Figures 7, 7A, 7B, 7C:
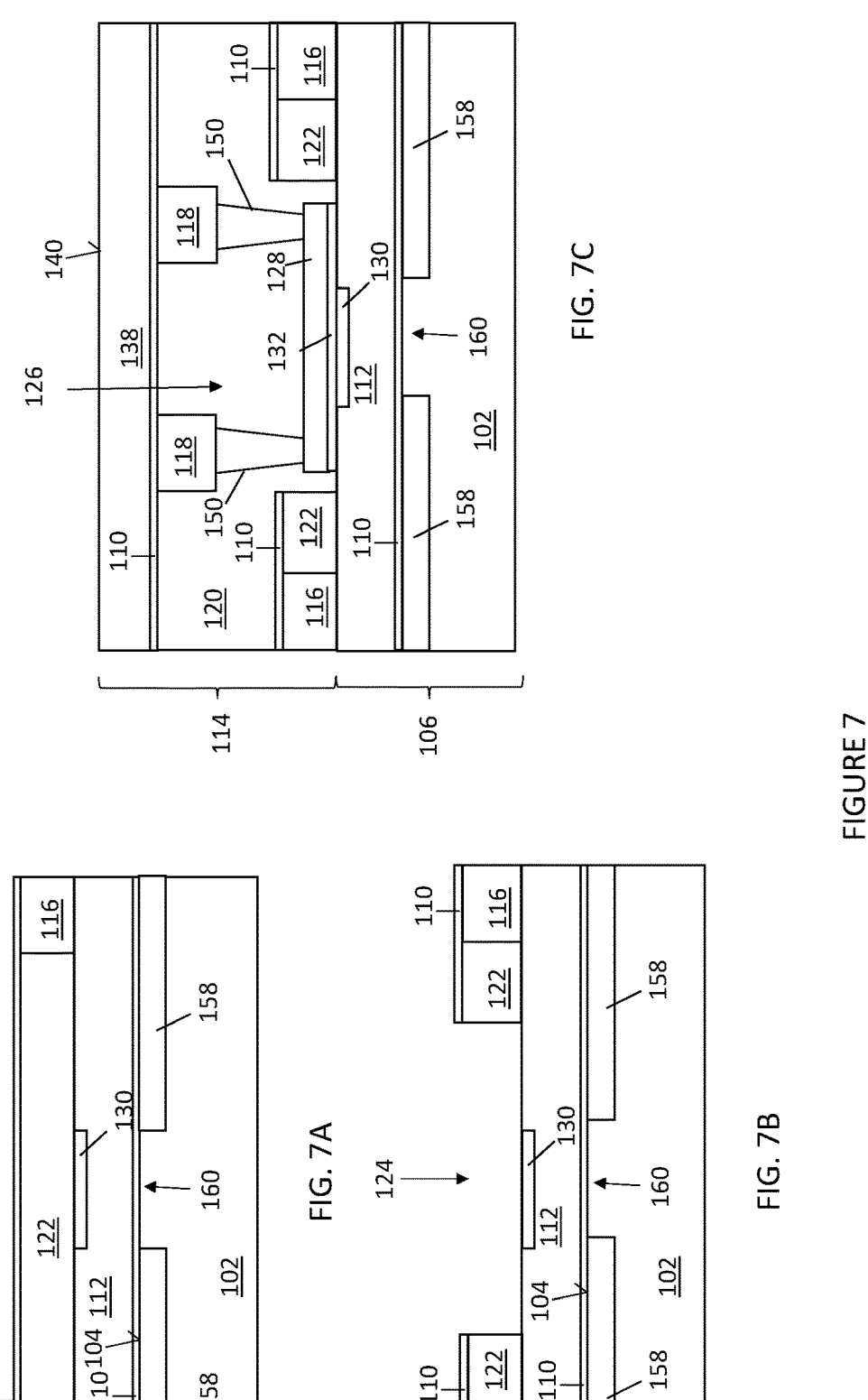
FIG. 7, which includes
FIGS. 7A, 7B and 7C, illustrates a method of forming a semiconductor device that comprises a PCM switching device, according to an embodiment.

Referring to FIG. 7, a method for forming the semiconductor device 100 is shown, according to another embodiment. The method steps shown in FIGS. 7A, 7B and 7C are similar to the respective steps shown in FIGS. 3A, 3B, and 3C, with the following differences. According to the method shown in FIG. 7, the semiconductor substrate 102 is provided to comprise at the main surface 104 dielectric regions 158 and a semiconductor region 160 that is laterally interposed between dielectric regions 158. This arrangement of the semiconductor substrate 102 can be produced in a number of different ways. For example, a so-called STI (shallow trench isolation) technique can be performed to form the dielectric regions 158. Alternatively, the semiconductor substrate 102 can be a so-called SOI substrate (silicon-on-insulator) wherein the dielectric regions 158 correspond to buried insulator portions of the semiconductor substrate 102. The semiconductor region 160 that is laterally interposed between dielectric regions 158 can be formed by etching deep trenches and subsequently filling these trenches with semiconductor material, e.g., by epitaxial deposition. The heating element 130 is disposed directly over the semiconductor region 160. This can be done using a self-aligned technique wherein the geometry of the heating element 130 and the semiconductor region 160 that is laterally interposed between dielectric regions 158 is attributable to a common mask structure and/or lithography mask. By providing the heating element 130 directly over the semiconductor region 160, efficient heat transfer between the PCM switching device 126 and the semiconductor substrate 102 is realized.

Referring to FIG. 8, a method for forming the semiconductor device 100 is shown, according to another embodiment. The method steps shown in FIGS. 8A, 8B and 8C are similar to the respective steps shown in FIGS. 3A, 3B, and 3C, with the following differences. According to the method shown in FIG. 8, the FEOL processing steps comprise forming a dielectric pedestal 162 on the main surface 104 of the semiconductor substrate 102. The dielectric pedestal 162 is formed before forming the heating element 130 and the pre-metal dielectric 112. The dielectric pedestal 162 can be compositionally similar or identical to the pre-metal dielectric 112, e.g., formed from silicon dioxide ($SiO_2$), silicon oxynitride ($SiO_XN_Y$). However, the dielectric pedestal 162 is selectively formed only in a substrate area wherein the PCM switching device 126 is to be located without being formed in a laterally adjacent area. This may be done by a masked etching technique, for example. The dielectric pedestal 162 allows for the heating element 130 to be elevated and arranged at or close to the bottom of the recess 124. Moreover, the dielectric pedestal 162 allows for a single processing step of forming the heating element 130 as part of the lower interconnect layer 108 and forming other structures in the lower interconnect layer 108 that are not elevated. For example, according to the technique of FIG. 8, a single processing step of forming the lower interconnect layer 108 electrode structures for an active semiconductor device 142 in a region of the semiconductor substrate 102 that is laterally adjacent to the recess 124, e.g., the gate electrode 144 and source and drain 146, 148 electrodes as described with reference to FIG. 1, and simultaneously forms the heating element 130.

Referring to FIG. 9, a method for forming the semiconductor device 100 is shown, according to another embodiment. As shown in FIG. 9A, all FEOL processing steps are performed such that the semiconductor device 100 comprises the passivation layer and the pre-metal dielectric 112. Different to the previous embodiments, none of the BEOL processing steps are performed before forming the recess 124. Thus, as shown in FIG. 9B, the recess 124 is formed before forming the first level metallization layer 116. As shown in FIG. 9C, the elements of the PCM switching device 126 are formed in the recess 124. By forming the elements of the PCM switching device 126 before forming the any metallization layer of the interconnection region 114, the PCM switching device 126 can be electrically connected to either one of the first level metallization layer 116, or an upper-level metallization layer, or both (as shown).

Referring to FIG. 10, a method for forming the semiconductor device 100 is shown, according to another embodiment. As shown in FIG. 10A, all FEOL processing steps are performed such that the semiconductor device 100 comprises the passivation layer and the pre-metal dielectric 112. Some BEOL processing steps are performed but the interconnection region 114 is not completed. In particular, the first level metallization layer 116, the second level metallization layer 118, the interlayer dielectric region 120 and the laterally isolating dielectric region 122 associated with the first level metallization layer 116, the second level metallization layer 118. As shown in FIG. 10B, the recess 124 is formed to extend through multiple dielectric layers of the BEOL region so as to reach the pre-metal dielectric 112 region. As shown in FIG. 10C, after forming the recess 124, the remaining elements of the PCM switching device 126 are formed in the recess 124, the recess 124 is filled with dielectric material, the PCM switching device 126 is electrically connected to the connecting one of the metallization's layers, and formation of the interconnection region 114 is completed. In this case, the process comprises forming a third level metallization layer 164, and this third level metallization layer 164 corresponds to the connecting one of the metallization layers. The concept shown in FIG. 10 can be extended to form any number of the metallization layers, e.g., three, four, five, etc., before forming the recess 124 and the PCM switching device 126 therein. Separately or in combination, any further number of the metallization layers, e.g., three, four, five, etc., may be formed after forming the recess 124 and the PCM switching device 126 therein.

Referring to FIG. 11, a method for forming the semiconductor device 100 is shown, according to another embodiment. As shown in FIG. 11A, all FEOL processing steps are performed, and the BEOL process is performed in a similar manner as in FIG. 10A. In this case, the FEOL processing steps comprise forming the heating element 130 and the first and second RF pads 152, 154, e.g., in a similar manner as described with reference to FIG. 4A. As shown in FIG. 11B, the recess 124 is then formed after forming the first and second level metallization layer 116, 118. As shown in FIG.

11C, the remaining elements of the PCM switching device 126 are formed. In this case, the electrical connection between the strip of phase change material 128 and the connecting one of the metallization layers is realized by the first and second RF pads 152, 154, e.g., in a similar manner as described with reference to FIG. 4C. The interconnection region 114 can then be completed by filling the recess 124 with a dielectric material. Optionally, a planarization step may be performed to form the planar upper surface 140. Since the first and second RF connections 134, 136 are realized by forming the strip of phase change material 128 on the first and second RF pads 152, 154, it is therefore not necessary to form any further metallization layers of the after forming the recess 124.

Referring to FIG. 12, a method for forming the semiconductor device 100 is shown, according to another embodiment. The method steps shown in FIGS. 12A, 12B and 12C are similar to the respective steps shown in FIGS. 11A, 11B, and 11C, with the following differences. The step of filling the recess 124 with a dielectric material is omitted. Hence, as shown in FIG. 12C, in the completed device the recess 124 is unfilled and comprises exposed sidewalls 166 that extend to the outer one of the of the dielectric layers from the interconnection region 114. As shown, the strip of phase change material 128 may be covered by an additional dielectric layer passivation layer 110 on its upper side so as to protect the PCM switching device 126 from the exterior environment.

Although the present disclosure is not so limited, the following numbered examples demonstrate one or more aspects of the disclosure.

Example 1. A method of forming a semiconductor device that comprises a phase change material switching device, the method comprising: providing a semiconductor substrate comprising a main surface; forming a dielectric region on the main surface; forming a recess in the dielectric region; forming a strip of phase change material within the recess; forming a heating element that is thermally coupled to the strip of phase change material; forming an interconnection region over the main surface before or after forming the recess, the interconnection region comprising one or more metallization layers and one or more dielectric layers; electrically connecting the strip of phase change material to a connecting one of the metallization layers from the interconnection region; and completing formation of the interconnection region after electrically connecting the strip of phase change material, and wherein completing formation of the interconnection region comprises forming an outer one of the dielectric layers from the interconnection region that is disposed over the connecting one of the metallization layers and comprises a planar upper surface.

Example 2. The method of example 1, wherein electrically connecting the strip of phase change material to the connecting one of the metallization layers comprises forming first and second RF connections that are each electrically connected between the strip of phase change material and the connecting one of the metallization layers.

Example 3. The method of example 2, wherein the one or more metallization layers of the interconnection region comprise a first level metallization layer and a second level metallization layer, the first level metallization layer being a closest metallization layer of the interconnection region to the main surface, the second level metallization layer being disposed over the first level metallization layer, and wherein completing formation of the interconnection region comprises forming the second level metallization layer.

Example 4. The method of example 2, further comprising forming a lower interconnect layer that is below the interconnect region, and wherein forming the first and second RF connections comprises forming first and second RF pads from the same material as the interconnect layer and before forming any of the one or more metallization layers of the interconnect region.

Example 5. The method of example 4, wherein the lower interconnect layer comprises a conductive material with a different composition as each of the one or more metallization layers of the interconnect region.

Example 6. The method of example 4, wherein the connecting one of the metallization layers is a first level metallization layer of the interconnection region, the first level metallization layer being a closest metallization layer of the interconnection region to the main surface, and wherein electrically connecting the strip of phase change material to the connecting one of the metallization layers comprises forming structured regions of the connecting one of the metallization layers that directly overlap with the first and second RF pads.

Example 7. The method of example 1, wherein the connecting one of the metallization layers is an upper-level metallization layer of the interconnection region that is spaced apart from the main surface by at least one of the one or more metallization layers of the interconnection region, and wherein forming the first and second RF connections comprises forming through-vias that are arranged within the recess.

Example 8. The method of example 1, wherein the heating element is formed below the recess and is vertically spaced apart from a bottom of the recess, and wherein the method further comprises forming a thermally conductive coupling element that extends to the bottom of the recess and thermally couples the heating element to the strip of phase change material.

Example 9. The method of example 1, wherein the semiconductor substrate comprises at the main surface a semiconductor region that is laterally interposed between dielectric regions, and wherein the heating element is disposed directly over the semiconductor region.

Example 10. The method of example 1, further comprising, before forming the interconnection region, forming a dielectric pedestal on the main surface of the semiconductor substrate and forming the heating element directly on the dielectric pedestal.

Example 11. The method of example 1, wherein at least one of the metallization layers of the interconnection region is formed before forming the recess.

Example 12. A method of forming a semiconductor device that comprises a phase change material switching device, the method comprising: providing a semiconductor substrate comprising a main surface; forming first and second RF pads and a heating element over the main surface; forming a recess in a dielectric region over the main surface such that the first and second RF pads and the heating element are exposed at a bottom of the recess; forming an interconnection region after forming the first and second RF pads, the interconnection region comprising one or more metallization layers and one or more dielectric layers; forming a strip of phase change material within the recess such that the heating element is thermally coupled to the strip of phase change material and such that the first and second RF pads are in ohmic contact with the strip of phase change material; and electrically connecting the first and second RF pads to a connecting one of the metallization layers from the interconnection region.

Example 13. The method of example 12, wherein the connecting one of the metallization layers is a first level metallization layer of the interconnection region, the first level metallization layer being a closest metallization layer of the interconnection region to the main surface, and wherein electrically connecting the first and second RF pads comprises forming structured regions of the first level metallization layer that directly overlap with the first and second RF pads.

Example 14. The method of example 12, wherein each metallization layer of the interconnection region is formed before forming the recess.

Example 15. A semiconductor device, comprising: a semiconductor substrate comprising a main surface; a dielectric region on the main surface; a recess in the dielectric region; a strip of phase change material within the recess; a heating element that is thermally coupled to the strip of phase change material; and an interconnection region disposed over the main surface that comprises one or more metallization layers and one or more dielectric layers, wherein the strip of phase change material is electrically connected to a connecting one of the metallization layers from the interconnection region, and wherein an outer one of the dielectric layers from the interconnection region is disposed over the connecting one of the metallization layers and comprises a planar upper surface.

Example 16. The semiconductor device of example 15, wherein the heating element is formed below the interconnect region and has a different composition as each metallization layer of the interconnection region.

Example 17. The semiconductor device of example 16, further comprising an active semiconductor device formed in a region of the substrate that is laterally adjacent to the recess, and wherein the active semiconductor device comprises an electrode structure that is formed in a lower interconnect layer which has the same composition as the heating element.

Example 18. The semiconductor device of example 17, wherein the lower interconnect layer comprises tungsten, polysilicon, or a metal silicide, and wherein each metallization layer of the interconnection region comprises copper or aluminum.

Example 19. The semiconductor device of example 16, further comprising first and second RF pads formed below the interconnect region, the wherein the strip of phase change material is electrically connected to the connecting one of the metallization layers by the first and second RF pads.

Example 20. The semiconductor device of example 19, wherein the connecting one of the metallization layers is a first level metallization layer of the interconnection region, the first level metallization layer being a closest metallization layer of the interconnection region to the main surface, and wherein structured regions of the first level metallization layer directly overlap with the first and second RF pads.

Example 21. The semiconductor device example 15, wherein the connecting one of the metallization layers is an upper level metallization layer of the interconnection region that is spaced apart from the main surface by at least one of the one or more metallization layers of the interconnection region, and wherein the strip of phase change material is electrically connected to the connecting one of the metallization layers by through-vias that extend through at least one of the one or more dielectric layers of the interconnection region.

Example 22. The semiconductor device of example 15, wherein the heating element is below the recess and is vertically spaced apart from a bottom of the recess, and wherein the semiconductor device further comprises a thermally conductive coupling element that extends to the bottom of the recess and thermally couples the heating element to the strip of phase change material.

Example 23. The semiconductor device of example 15, wherein the semiconductor substrate comprises at the main surface a semiconductor region that is laterally interposed between dielectric regions, and wherein the heating element is disposed directly over the semiconductor region.

Example 24. The semiconductor device of example 15, wherein an outer one of the dielectric layers from the interconnection region is disposed over the connecting one of the metallization layers and comprises a planar upper surface.

Example 25. The semiconductor device of example 15, wherein the recess is unfilled and comprises exposed sidewalls that extend to an outer one of the dielectric layers from the interconnection region.

The methods and structures disclosed herein with reference to specific figures are applicable to all other embodiments to the extent consistent with these other embodiments. For instance, particular techniques, materials, steps and so-forth describing a method of forming a device represented by one figure may be applied to any other method represented by other figures, to the extent consistent with these other methods. Likewise, particular device features, structures or arrangements disclosed in connection with a device represented by one figure may be incorporated into a device represented any other figures, to the extent consistent with these other devices.

The term "electrically connected," "directly electrically connected" and the like as used herein describes a permanent low-impedance connection between electrically connected elements, for example a direct contact between the relevant elements or a low-impedance connection via a metal and/or a highly doped semiconductor.

The term "in ohmic contact" "ohmic connection" and the like as used herein refers to an electrical connection between two elements that form a non-rectifying electrical junction with one another. That is, ohmic contacts facilitate current flow in two directions between the two elements. The two elements may directly physically contact one another, or thin intermediate films may be provided between the two elements to facilitate linear I-V characteristics.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of forming a semiconductor device that comprises a phase change material switching device, the method comprising:

providing a semiconductor substrate comprising a main surface;

forming a dielectric region on the main surface;

forming a recess in the dielectric region;

forming a strip of phase change material within the recess;

forming a heating element that is thermally coupled to the strip of phase change material;

forming an interconnection region over the main surface before or after forming the recess, the interconnection region comprising one or more metallization layers and one or more dielectric layers;

electrically connecting the strip of phase change material to a connecting one of the metallization layers from the interconnection region; and completing formation of the interconnection region after electrically connecting the strip of phase change material, and wherein completing formation of the interconnection region comprises forming an outer one of the dielectric layers from the interconnection region that is disposed over the connecting one of the metallization layers and comprises a planar upper surface, wherein forming the dielectric region comprises growing one or more layers of dielectric material, and wherein forming the recess comprises removing material from a lateral surface of the dielectric region, thereby forming the recess to extend from the lateral surface into the one or more layers of dielectric material.

2. The method of claim 1, wherein electrically connecting the strip of phase change material to the connecting one of the metallization layers comprises forming first and second RF connections that are each electrically connected between the strip of phase change material and the connecting one of the metallization layers.

3. The method of claim 2, wherein the one or more metallization layers of the interconnection region comprise a first level metallization layer and a second level metallization layer, the first level metallization layer being a closest metallization layer of the interconnection region to the main surface, the second level metallization layer being disposed over the first level metallization layer, and wherein completing formation of the interconnection region comprises forming the second level metallization layer.

4. The method of claim 2, further comprising forming a lower interconnect layer that is below the interconnect region, and wherein forming the first and second RF connections comprises forming first and second RF pads from the same material as the interconnect layer and before forming any of the one or more metallization layers of the interconnect region.

5. The method of claim 4, wherein the lower interconnect layer comprises a conductive material with a different composition as each of the one or more metallization layers of the interconnect region.

6. The method of claim 4, wherein the connecting one of the metallization layers is a first level metallization layer of the interconnection region, the first level metallization layer being a closest metallization layer of the interconnection region to the main surface, and wherein electrically connecting the strip of phase change material to the connecting one of the metallization layers comprises forming structured regions of the connecting one of the metallization layers that directly overlap with the first and second RF pads.

7. The method of claim 1, wherein the connecting one of the metallization layers is an upper-level metallization layer of the interconnection region that is spaced apart from the main surface by at least one of the one or more metallization layers of the interconnection region, and wherein forming the first and second RF connections comprises forming through-vias that are arranged within the recess.

8. The method of claim 1, wherein the heating element is formed below the recess and is vertically spaced apart from a bottom of the recess, and wherein the method further comprises forming a thermally conductive coupling element that extends to the bottom of the recess and thermally couples the heating element to the strip of phase change material.

9. The method of claim 1, wherein the semiconductor substrate comprises at the main surface a semiconductor region that is laterally interposed between dielectric regions, and wherein the heating element is disposed directly over the semiconductor region.

10. The method of claim 1, further comprising, before forming the interconnection region, forming a dielectric pedestal on the main surface of the semiconductor substrate and forming the heating element directly on the dielectric pedestal.

11. The method of claim 1, wherein at least one of the metallization layers of the interconnection region is formed before forming the recess.

12. The method of claim 1, wherein forming the recess comprises a masked etching technique.

13. The method of claim 1, further comprising filling the recess with dielectric material after forming the heating element and the strip of phase change material.

14. The method of claim 1, wherein the recess comprises sidewalls that extend transversely to lateral surface of the dielectric region.

\* \* \* \* \*